United States Patent [19]

Naito

[11] Patent Number: 5,168,252
[45] Date of Patent: Dec. 1, 1992

[54] LINE FILTER HAVING A MAGNETIC COMPOUND WITH A PLURALITY OF FILTER ELEMENTS SEALED THEREIN

[75] Inventor: Akira Naito, Sagamihara, Japan

[73] Assignee: Mitsubishi Denki Kabushiki Kaisha, Tokyo, Japan

[21] Appl. No.: 631,890

[22] Filed: Dec. 21, 1990

[30] Foreign Application Priority Data

Apr. 2, 1990 [JP] Japan .................................. 2-87709

[51] Int. Cl.⁵ ............................................... H03H 7/00
[52] U.S. Cl. .................................... 333/185; 333/167; 333/181
[58] Field of Search .............. 333/167, 175, 176, 178, 333/183, 185, 181, 12, 1, 100, 24 R; 361/400, 401; 439/620; 174/52.4

[56] References Cited

U.S. PATENT DOCUMENTS

| | | | |
|---|---|---|---|
| 3,644,848 | 2/1972 | Kruczek | 333/185 X |
| 4,636,752 | 1/1987 | Saito | 333/185 X |
| 4,760,357 | 7/1988 | Yamaguchi | 333/181 |
| 4,795,991 | 1/1989 | Saito et al. | 333/181 |
| 5,034,710 | 7/1991 | Kawaguchi | 333/185 |

FOREIGN PATENT DOCUMENTS

| | | |
|---|---|---|
| 57-27100 | 2/1982 | Japan . |
| 60-119714 | 8/1985 | Japan . |
| 62-18739 | 1/1987 | Japan . |
| 0284509 | 11/1990 | Japan . |

*Primary Examiner*—Eugene R. LaRoche
*Assistant Examiner*—Ali Neyzari
*Attorney, Agent, or Firm*—Oblon, Spivak, McClelland, Maier & Neustadt

[57] ABSTRACT

A filter which includes: a plurality of filter elements. The filter elements are composed of magnetic beads and a magnetic compound is provided wherein the filter elements sealed therein. The magnetic beads may be arranged in a single column magnetic compound, may be formed of a cubic shape or may be arranged in a parallel column therein.

4 Claims, 2 Drawing Sheets

LINE FILTER HAVING A MAGNETIC COMPOUND WITH A PLURALITY OF FILTER ELEMENTS SEALED THEREIN

BACKGROUND OF THE INVENTION

1. Field of the Invention

The present invention relates to a line filter for signals which can be utilized in an electronic circuit.

2. Discussion of Background

Referring now to FIG. 6, there is shown a perspective view of a typical example of a conventional line filter for signals, in particular a conventional filter of ferrite beads, which has been widely used to reduce electromagnetic noises in an electronic circuit.

The ferrite beads 2a can be constituted to absorb electromagnetic noises in a signal by means of high-frequency loss.

In more detail, as shown in FIG. 6, the filter of the magnetic beads 2a has a lead 1i passed therethrough in order to make use of the property that the magnetic beads 2a exhibit high impedance for high-frequency. The filter of the magnetic beads 2a with the lead 1a in it has been used as a signal line filter in an electronic circuit.

However, the conventional arrangement wherein a plurality of the filters are respectively composed of a discrete part (i.e., a single device) are used in an electronic device creates problems in that the number of mounting steps, the area required for mounting, and the like are great.

SUMMARY OF THE INVENTION

It is an object of the present invention to solve the problems involved in the conventional filter and to provide a new and improved filter capable of improving the filter effect, and increasing the mounting density.

The foregoing and other objects of the present invention have been attained by providing a filter comprising a plurality of filter elements, the filter elements being composed of magnetic beads, and a magnetic compound having the filter elements sealed therein.

In accordance with the present invention, a plurality of the filter elements composed of the magnetic beads are formed in the form of a general purpose package, and are combined with a magnetic compound as a composite unit. This arrangement can make the mounting space occupied by a required number of the filters more compact, and can decrease the required number of the mounting steps. In addition, the arrangement can improve the filter effect, and increase the mounting density of the filter elements.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 4:
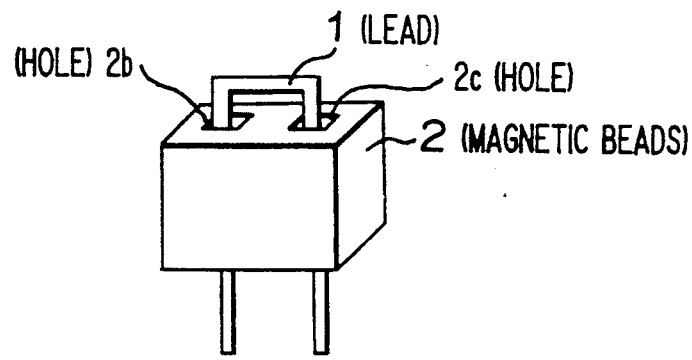
FIG. 4 is a perspective view showing an example of the filter elements which are used in the embodiments.

Referring now to the drawings, wherein like reference numerals designate identical or corresponding parts throughout the several views, and more particularly to FIG. 4 thereof, there is shown a perspective view of an example of the filter element for the filter according to the present invention.

In FIG. 4, reference numeral 1 designates a lead. Reference numeral 2 designates a filter element of magnetic beads which are made of ferrite or the like, and through which two holes 2b, 2c for the lead 1 are formed.

Figure 1:
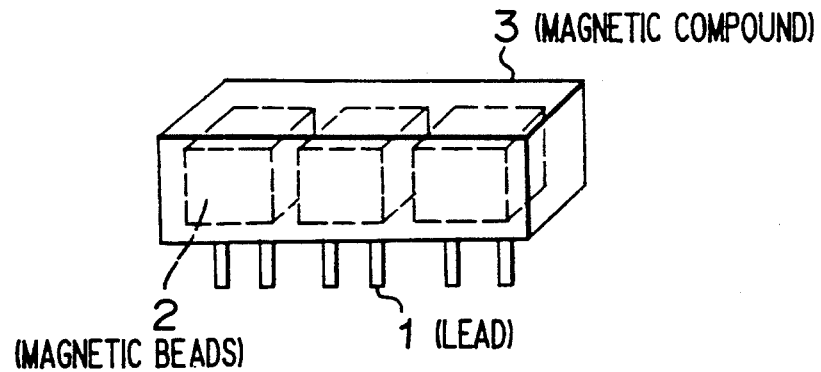
FIGS. 1 though 3 are perspective views of three embodiments of the filter according to the present invention.

Referring now to FIG. 1, there is shown a perspective view of a first embodiment of the filter according to the present invention. In the filter, a plurality of the magnetic beads 2 as the filter element (in FIG. 1, the number of the magnetic beads 2 is three) are arranged in line. The filter is formed as a composite body in a cubic shape, using a magnetic compound 3.

Figure 5:
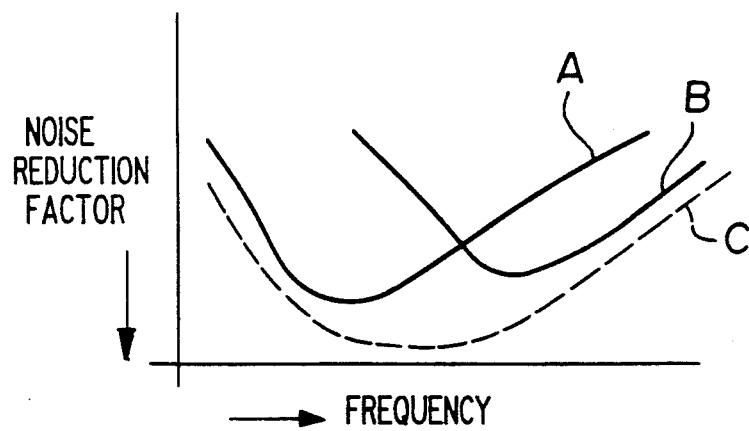
FIG. 5 is a graph showing the reduction property of the embodiments.
Figure 6:
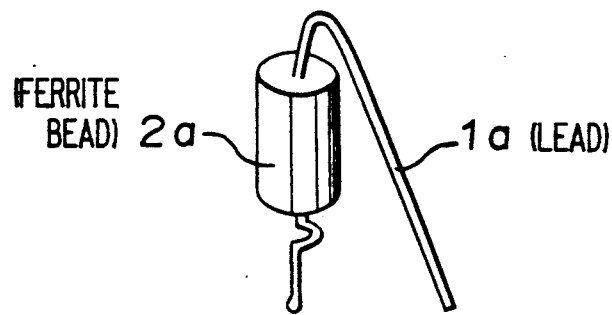
FIG. 6 is a perspective view showing a typical example of a conventional filter.

The filter of the first embodiment exhibits a noise reduction factor as shown in the characteristic curves of reduction factor with respect to frequency of FIG. 5 where the filter element of the magnetic beads 2 brings about a reduction effect indicated by a curve A, the magnetic compound 3 brings about a reduction effect indicated by a curve B, and both totally exhibit a reduction factor indicated by a curve C of a dotted line. It is shown that the combination of the magnetic compound 3 and the magnetic beads 2 as a composite body is effective in a wider range of frequency bands and obtain a greater reduction factor in comparison with the reduction characteristic curve A of the respective filter elements.

A plural set of the magnetic beads 2 can be arranged in a general purpose form to be used mingling with other electronic parts. The mounting density can be increased, and the mounting can be facilitated.

Figure 2:
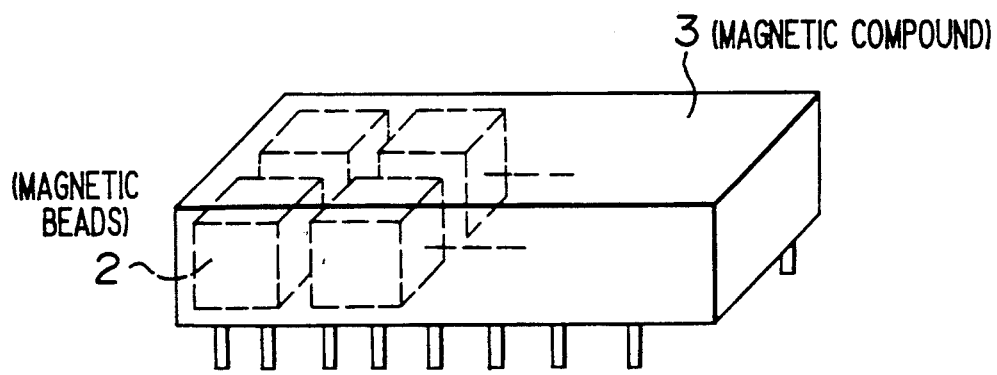
Figure 3:
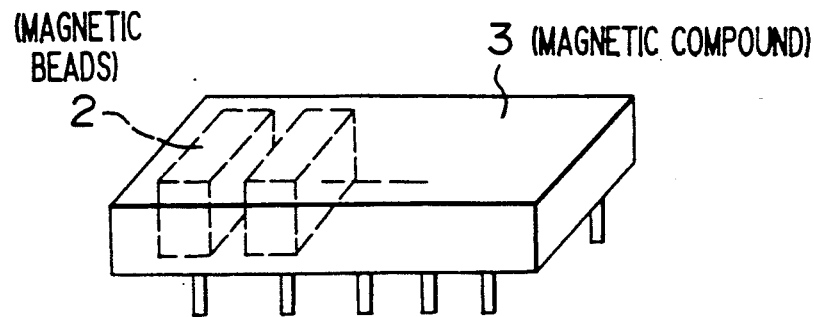

Although in the first embodiment the magnetic beads 2 are arranged in a single column, i.e. in a single in-line form, the magnetic beads 2 can be arranged in a parallel column, i.e. a dual in-line form or the like as shown as a second and a third embodiment in FIGS. 2 and 3, the second and third embodiments also offering advantage similar to the first embodiment.

Although in the first to third embodiments, the magnetic beads are combined with the magnetic compound as the composite body, the magnetic beads can be formed as a filter by use of a general purpose resin when it is enough to provide even only the magnetic beads to obtain a desired effect.

Obviously, numerous modifications and variations of the present invention are possible in light of the above teachings. It is therefore to be understood that within the scope of the appended claims, the invention may be practiced otherwise than as specifically described herein.

What is claimed is:

1. A filter comprising:
   a column of separated filter elements wherein said filter elements each comprise a magnetic bead; and
   a magnetic compound having the filter elements separately sealed therein so as to form a composite body.

2. A filter according to claim 1, wherein the filter elements are arranged in a single column in said magnetic compound.

3. A filter according to claim 1, wherein each magnetic bead is formed of a cubic shape.

4. A filter according to claim 1, wherein the filter elements are arranged in parallel columns.

* * * * *